United States Patent
King et al.

[11] Patent Number: 5,998,071
[45] Date of Patent: Dec. 7, 1999

[54] METHOD TO MONITOR LENS HEATING EFFECTS

[75] Inventors: Mingchu King; Chih-Chien Hung; Shih-Shiung Cheu, all of Hsin-Chu, Taiwan

[73] Assignee: Taiwan Semiconductor Manufacturing Company, Ltd., Hsin-Chu, Taiwan

[21] Appl. No.: 09/048,211

[22] Filed: Mar. 26, 1998

[51] Int. Cl.[6] .................................................. G03C 5/00
[52] U.S. Cl. ................................ 430/30; 430/369; 374/45
[58] Field of Search ........................... 374/45, 141, 127; 430/30, 320, 330, 322, 369

[56] References Cited

U.S. PATENT DOCUMENTS

| | | | |
|---|---|---|---|
| 5,655,110 | 8/1997 | Krivokapic et al. | 395/500 |
| 5,674,650 | 10/1997 | Dirksen et al. | 430/22 |
| 5,723,238 | 3/1998 | Moore et al. | 430/30 |
| 5,763,143 | 6/1998 | Sakura | 430/30 |
| 5,811,211 | 9/1998 | Tanaka et al. | 430/30 |
| 5,821,014 | 10/1998 | Chen et al. | 430/30 |
| 5,840,451 | 11/1998 | Moore et al. | 430/30 |
| 5,879,843 | 3/1999 | Ueno | 430/30 |
| 5,902,704 | 5/1999 | Schoenborn et al. | 430/30 |
| 5,916,716 | 6/1999 | Butsch et al. | 430/30 |

*Primary Examiner*—Diego Gutierrez
*Assistant Examiner*—Jeanne-Marguerite Goodwin
*Attorney, Agent, or Firm*—George O. Saile; Stephen B. Ackerman

[57] ABSTRACT

A low cost, fast method for evaluating the effects of lens heating in a step and repeat projection system is disclosed. The first step is to form a series of photoresist images on a single substrate in the same way as would be done during normal stepping and repeating. The first few images, located centrally, will be produced by a cool lens. As more images are generated, the lens gradually heats up so that the final few images, which are placed alongside the 'cool' images, will be produced by a hot lens. Critical dimension bars are present in all image fields (at diagonally opposite corners and in the center), their size in the developed photoresist being an indication of the extent to which the focal plane has drifted. This is then used to compute correction factors for the manufacturer's scaling constants and/or to evaluate the extent, if any, of curvature of field in the projected images.

18 Claims, 4 Drawing Sheets

METHOD TO MONITOR LENS HEATING EFFECTS

FIELD OF THE INVENTION

The invention relates to the general field of photolithography with particular reference to the effects of heating on projection lenses.

BACKGROUND OF THE INVENTION

A standard feature of integrated circuit manufacture is the use of step and repeat cameras during photolithography. Since a semiconductor wafer is far too large for it to be possible to project a single image, that is in focus and free of distortion, over the entire surface, only a small part of the final pattern (called a reticle) is exposed at any given time. This sub-image is repeated many times by the step and repeat camera which moves with great precision from one location to another until the full pattern on the wafer has been exposed.

These repeated exposures directed through the lens of the step and repeat camera cause it to steadily heat up as stepping and exposing proceed. Since the optical tolerances in systems of this type are extremely tight, even the relatively gentle heating of the lens in this way (estimated to be between about 0.05 and 0.3° C.) is sufficient to introduce a number of problems:

1. focus drift
2. magnification drift
3. distortion
4. curvature of field

Problems 1 and 2 can be overcome by appropriate adjustment of the system. Thus, the location of the resist surface can be moved to coincide with the new focal plane and the magnification of the system can be increased or decreased, as needed to compensate for the heating effect. The manufacturers of such systems are well aware of the lens heating problem. In FIG. 1 we show a curve of the focus correction recommended by a manufacturer as a function of time, while step and repeat image projection is taking place. The effects of lens heating are first felt after about 15 minutes (in this case), following which the repeated increase and decrease in the lens temperature can clearly be seen. After about 40 minutes the lens temperature had reached its maximum and the run was terminated.

While the curve of FIG. 1 is useful for illustrating the lens heating effect, it is of greater value to users for the manufacturer to provide data that can be used to drive the software that controls the system. In general, such data takes the form of two scaling constants $\mu_1$ and $\mu_2$ expressed in microns per watt, and two time constants $\tau_1$ and $\tau_2$.

Problem b 3is relatively minor but problem 4 (curvature of field) can introduce serious difficulties. It can be eliminated, or at least minimized, only by proper design of the original lens system and, should it occur, cannot be compensated for in the manner already described for dealing with problems 1 and 2. Even in the latter case, while the time constants are valid over a wide range of operating conditions, they depend on the lens quality and the cooling time. The focus drift will vary somewhat as factors such as reticle pattern, exposure sequence, exposure energy, and light intensity change.

Thus, additional information, beyond what the manufacturer has provided, needs to be gathered by the user if he is to get maximum performance from the projection system. In particular, the extent to which curvature of field is a problem under the intended operating conditions needs to be determined and correction factors for the manufacturer's scaling constants need to be measured.

In the prior art this has been achieved by modelling the lens cooling curve as measured by an image sensor combined with the compensated level sensor height. While this method enables the lens heating machine constants to be fine-tuned very accurately, its implementation is both time consuming and relatively expensive. As will be described below, the present invention makes possible the measurement of these constants in a short time at a minimal cost. The present invention also makes it possible to quickly determine the extent to which a given projection system is subject to curvature of field as a result of lens heating.

We have been unable to find any prior art that teaches the approach taken by the present invention, but note the following to be of interest. Dirksen et al. (U.S. Pat. No. 5,674,650 October 1997) evaluate the performance of a step and repeat projection system by means of an image sensor in conjunction with a set of test marks. Krivokapic et al. (U.S. Pat. No. 5,655,110 August 1997) teach a method for analyzing and evaluating the contribution of various process parameters to the quality of the final image. This makes it possible to concentrate process control in the areas where there is the most leverage.

SUMMARY OF THE INVENTION

It has been an object of the present invention to provide a method whereby the effects of lens heating may be rapidly and cost effectively evaluated.

Another object of the invention has been to be able to determine correction factors for the scaling constants provided by the manufacturers of step and repeat projection systems, as needed.

Still another object has been to provide a quick and easy method for estimating the extent and direction of curvature of field in a lens system that has been heated.

These objects have been achieved by forming a series of photoresist images on a single substrate in the same way as would be done during normal stepping and repeating. The first few images, located centrally, will be produced by a cool lens. As more images are generated, the lens gradually heats up so that the final few images, which are placed alongside the 'cool' images, will be produced by a hot lens. Critical dimension bars are present in all images (at diagonally opposite corners and in the center), their size in the developed photoresist being an indication of the extent to which the focal plane has drifted. This is then used to compute correction factors for the manufacturer's scaling constants and/or to evaluate the extent, if any, of curvature of field in the projected images.

DESCRIPTION OF THE PREFERRED EMBODIMENTS

The present invention teaches a method for rapidly determining what correction factors need to be applied to data supplied by a manufacturer since the process of the user is not, in general, exactly the same as the process of the manufacturer at the time that the scaling constants were measured by the manufacturer. As already mentioned, the scaling constants can be affected by process variables such as numerical aperture, degree of coherence, reticle pattern, exposure sequence, the critical dimension, etc.

Accordingly, these various process variables, once their values have been selected, are not altered during the application of the method of the present invention which begins with the provision of a suitable substrate. The latter, most commonly, is a silicon wafer but the invention is not restricted to this. Similarly, the surface of the silicon wafer, if one is used, may be uncoated or may be coated with a layer of material such as polysilicon, silicon oxide, or a metal.

Figure 1:
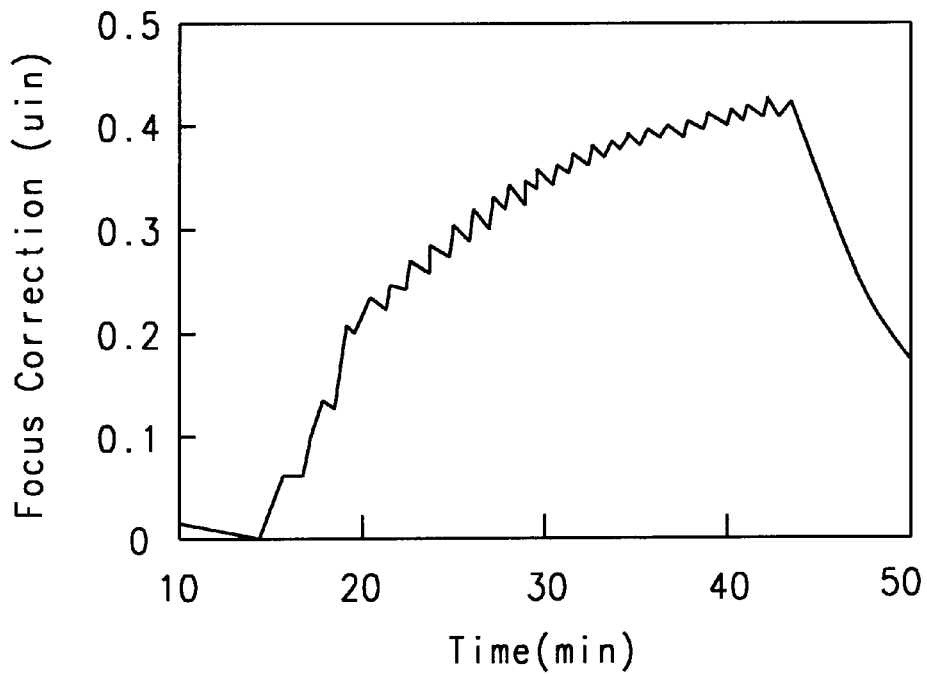
FIG. 1 is a curve showing how the focus adjustment varies with lens temperature.
Figure 2:
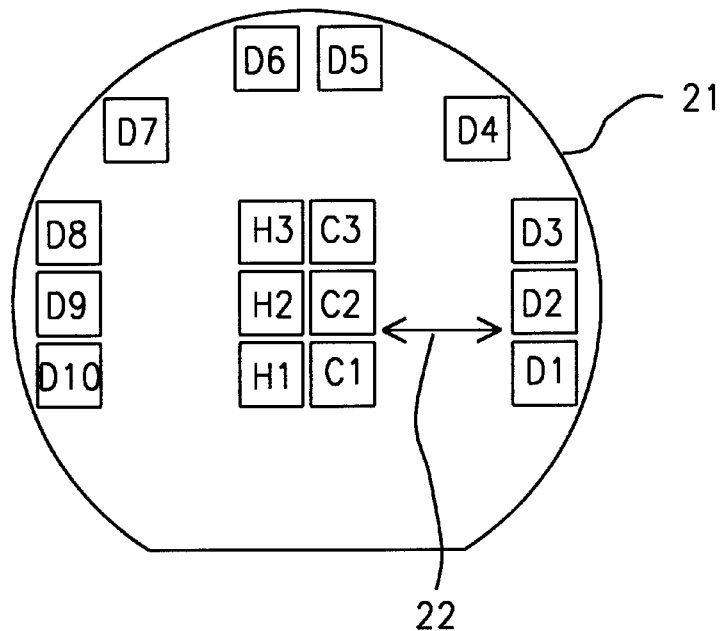
FIG. 2 illustrates the placement of successively exposed images according to the method of the present invention.

Referring now to FIG. 2, the chosen substrate 21 is coated with a layer of photoresist to a thickness between about 1.07 and 1.08 microns. Starting with the projection lens at room temperature, a series of exposures (to actinic radiation) is made, through the lens, using a reticle pattern that includes a resolution pattern (see below). We will refer to the resulting latent images in the photoresist as cool lens images. These cool lens images are located near the substrate center. Three such images, designated C1, C2, and C3, are shown in FIG. 2 although the actual number of the cool images could be anywhere from 1 to about 5, depending on how well the layout being checked is able to avoid stray light from the dummy patterns while they are being used to heat the lens.

The next step is raise the lens temperature by making a series of photoresist exposures through it. To prevent excessive cooling of the lens between exposures, the time period between these successive exposures should be between about 1 and 10 seconds. We will refer to the latent images resulting from this set of exposures as dummy images. Their exact location on the substrate is unimportant as long as there is a minimum separation of about 3 mm. between them and the cool images. This minimum separation (shown as 22 in the figure) is necessary to avoid the possibility that stray light from them (during exposure) reaches the cool images whereby the size of the developed cool images could be affected.

In practice, it is simplest to locate the dummy images around the periphery of the substrate. These are schematically illustrated in FIG. 2 as image fields D1 through D10 although the actual number of dummy images could be anywhere from about 2 to about 12, depending on the degree of lens heating that it is desired to achieve. To raise the lens temperature to the point of equilibrium with its surroundings (estimated to be between about 0.01 and 0.3° C.), would typically require between about 10 and 500 dummy exposures. Since the number of dummy images is relatively small, each was exposed 48 times.

Once the desired number of dummy exposures have been made, stepping continues without delay (so the lens remains at the intended temperature) and a series of exposures located near the substrate center, adjacent to the cool lens images, are formed. We refer to these latent images in the photoresist as hot lens images. Three such images, designated H1, H2, and H3, are shown in FIG. 2 although the actual number of hot images could be anywhere from 1 to about 5.

Figure 3:
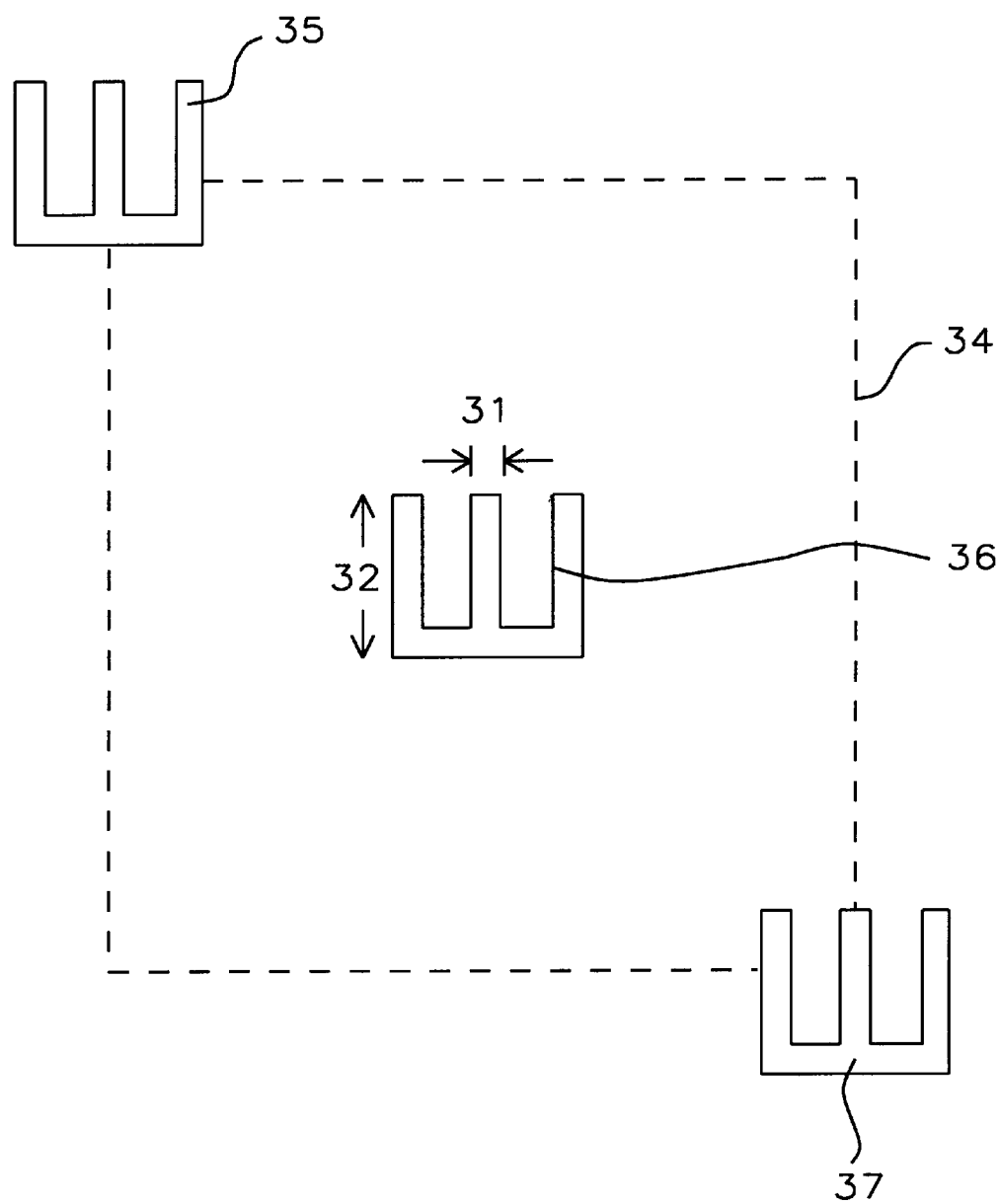
FIG. 3 is a close-up view of the resolution features (critical dimension bars) used by the present invention.

The exposing process is now terminated and the photoresist is developed in the normal way, so that a set of images from a cold lens are formed next to a set from a hot lens. To measure the optical performance of the system, the resolution pattern shown schematically in FIG. 3 is used. Dashed line 34 represents the boundary of the field occupied by the projected image. Most of the interior of 34 will be filled with a typical integrated circuit mask pattern (which could be anywhere from very sparse to very dense) but critical dimension (CD) bars 35, 36, and 37 are used to make the resolution measurements. They are placed at diagonally opposite corners and in the center. The actual resolution bars are much smaller (relative to the total field) than shown in the figure. They are chosen so that the width of the middle bar equals the critical dimension (when the projection system is operating correctly). For dimension bars 36 this is width 31. Length 32 of the bars is typically between about 0.25 and 0.6 microns.

Any resolution bars that were formed in a photoresist layer that was not exactly in the focal plane at the time of exposure will have a width that is less than the critical dimension. The difference between this and the critical dimension is referred to as the bias value. Thus the bias value for a given lens temperature is readily obtained by measuring the widths of the hot and cold CD bars and computing the difference.

If the bias values for all three CD bars are the same then curvature of field is not present. Conversely, if they are different, the amount and direction of the curvature can be computed.

The average bias value for all three CD bars will be a measure of the extent to which the scaling constants provided by the manufacturer need to be adjusted. Thus, a simple multiplier whose value is directly proportional to the bias can be readily derived.

Figure 4:
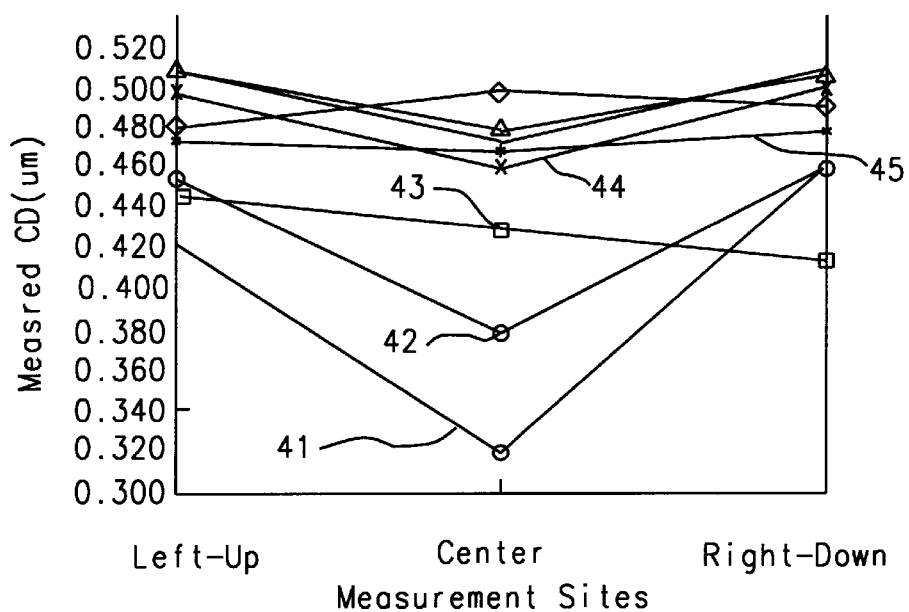
FIG. 4 is a plot of the measured critical dimension, in three positions within the image field, for several different lens conditions.

In FIG. 4 we show the results of a series of CD measurements made on patterns that were prepared as described above. To make the actual measurement the CD bar images were enlarged by means of a scanning electron microscope by a known amount (typically between about 35,000 and 50,000 times). The critical dimensions for the hot and cold bars could then be readily read off the micrographs. These have been plotted for the three locations at which the CD bars were located. Curves 41–44 are for the hot images, the remainder being for the cold ones.

Figure 5:
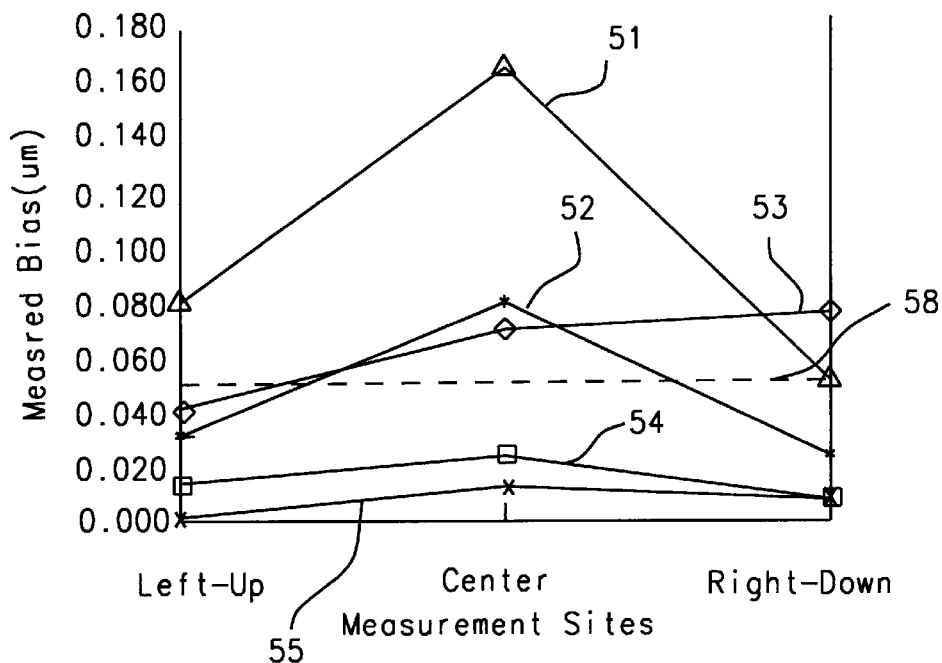
FIG. 5 presents the data of FIG. 4 in terms of the measured bias.

Although the unsatisfactory performance of the hot lens in some cases is already apparent in curves 41 and 42 of FIG. 4, the data is more graphically displayed in FIG. 5 where the bias values are plotted. These were obtained by subtracting the set of cold curves from the set of hot curves. In FIG. 5, the curves 51–55 correspond to curves 41–45, respectively, from FIG. 4. Plotting the data this way allows a line to be drawn (such as dashed line 58) which separates acceptable optical behavior from what is unacceptable. Thus, the projection system is readily seen to have performed satisfactorily for the conditions under which curves 54 and 55 were generated. On the other hand, the performance under the conditions associated with curves 51–53 is not acceptable. This type of plot also shows that curves 54 and 55 are relatively flat, indicating little or no curvature of field, while curves 51 and 52 make it immediately clear that curvature of field is a serious problem for the conditions under which they were generated.

Figure 6:
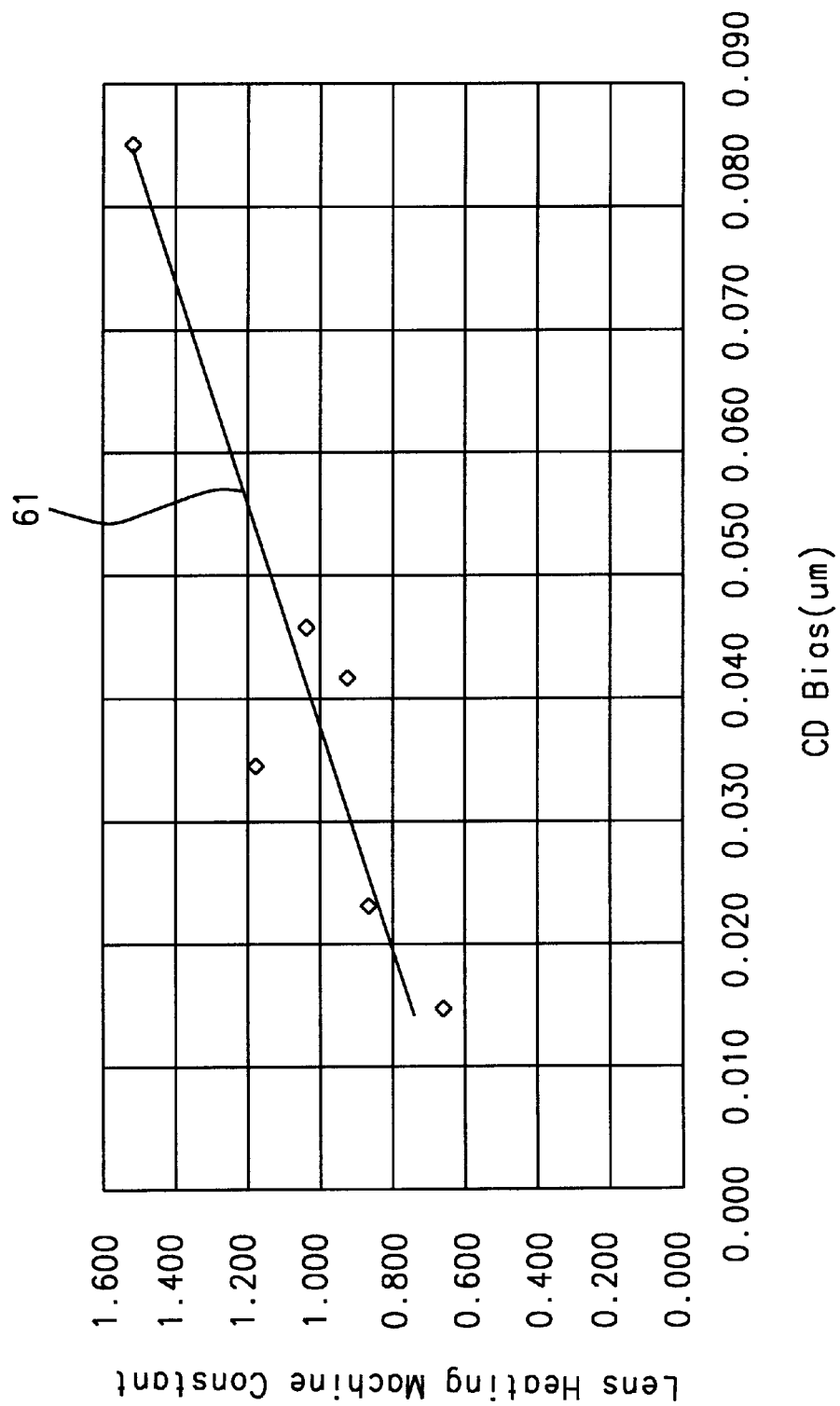
FIG. 6 is a plot of the lens heating constant as a function of the CD bias.

Whether or not curvature of field is involved, it is also desirable to be able to derive the corrected scaling constants through a simple calculation. An example of how this would be done is shown in FIG. 6 where the lens heating constant has been plotted as a function of CD bias. It can readily be confirmed that straight line curve 61 is described by the linear equation (heating constant)=11.125×(CD bias in microns)+0.6015

While the invention has been particularly shown and described with reference to the preferred embodiments thereof, it will be understood by those skilled in the art that various changes in form and details may be made without departing from the spirit and scope of the invention.

What is claimed is:

1. A method to monitor abnormal effects of lens heating, comprising:

providing a substrate having a center and a periphery;

coating the substrate with a layer of photoresist;

while the lens is at room temperature, forming a first number of latent cool lens images in the photoresist, near the substrate center, by directing actinic radiation through a reticle that includes a resolution pattern, and through said lens;

forming a second number of dummy images in the photoresist, near the substrate periphery, separated by a distance from the cool lens images, by directing actinic radiation through the lens at successive time intervals, thereby causing the lens to heat;

without delay, forming a first number of latent hot lens images in the photoresist, near the substrate center and adjacent to the cool lens images, by directing actinic radiation through the reticle and through said lens;

developing the photoresist whereby cool and hot developed images, that include critical dimension bars having widths, are formed from said latent images; and computing a bias due to lens heating by subtracting the widths of the critical dimension bars measured in the hot developed images from the widths of the critical dimension bars measured in the cool developed images.

2. The method of claim 1 wherein said first number of latent hot lens images is between 1 and about 5.

3. The method of claim 1 wherein said second number of dummy images is between 1 and about 12.

4. The method of claim 1 wherein each of said successive time intervals is between about 1 and 30 seconds.

5. The method of claim 1 wherein the resolution patterns further comprise critical dimension bars centrally located within said developed images as well as at diagonally opposite corners of said developed images.

6. The method of claim 1 wherein the substrate is a silicon wafer.

7. The method of claim 1 wherein said distance separating the dummy images from the cool latent images is more than about 3 mm.

8. The method of claim 1 wherein causing the lens to heat further comprises raising its temperature by between about 0.05 and 0.3° C.

9. The method of claim 1 wherein said coating of photoresist has a thickness that is between about 1.07 and 1.08 microns.

10. A method to determine a lens heating correction factor for a photolithographic projection system having known scaling constants, comprising:

providing a silicon wafer having a center and a periphery;

coating the wafer with a layer of photoresist;

while the lens is at room temperature, forming a first number of latent cool lens images in the photoresist, near the wafer center, by directing actinic radiation through a reticle that includes a resolution pattern, and through said lens;

forming a second number of dummy images in the photoresist, near the wafer periphery, separated by a distance from the cool lens images, by directing actinic radiation through the lens at successive time intervals, thereby causing the lens to heat;

without delay, forming a first number of latent hot lens images in the photoresist, near the wafer center and adjacent to the cool lens images, by directing actinic radiation through the reticle and through said lens;

developing the photoresist whereby cool and hot developed images are formed, said developed images to include resolution patterns that comprise critical dimension bars, having a width, centrally located within the developed images as well as at diagonally opposite corners of the developed images;

measuring the widths of all critical dimension bars;

subtracting the widths measured in the hot developed images from the widths measured in the cool developed images thereby generating bias values, for each of said locations within the developed images; and from said bias values computing correction factors for said scaling constants.

11. The method of claim 10 wherein said first number of latent hot lens images is between 1 and about 5.

12. The method of claim 10 wherein said second number of dummy images is between 1 and about 12.

13. The method of claim 10 wherein each of said successive time intervals is between about 1 and 30 seconds.

14. The method of claim 10 wherein said distance separating the dummy images from the cool latent images is more than about 3 mm.

15. The method of claim 10 wherein causing the lens to heat further comprises raising its temperature by between about 0.05 and 0.3° C.

16. The method of claim 10 wherein said coating of photoresist has a thickness that is between about 1.07 and 1.08 microns.

17. The method of claim 10 further comprising deriving a linear equation that relates the multiplying factor to said bias values.

18. The method of claim 10 wherein measuring the widths of all critical dimension bars further comprises using a scanning electron microscope of known magnification to generate a micrograph of the bars.

* * * * *